United States Patent
Wang

(10) Patent No.: US 7,987,334 B2
(45) Date of Patent: Jul. 26, 2011

(54) APPARATUS, SYSTEM, AND METHOD FOR ADJUSTING MEMORY HOLD TIME

(75) Inventor: WenWei Wang, Gilroy, CA (US)

(73) Assignee: International Business Machines Corporation, Armonk, NY (US)

( * ) Notice: Subject to any disclaimer, the term of this patent is extended or adjusted under 35 U.S.C. 154(b) by 668 days.

(21) Appl. No.: 12/039,586

(22) Filed: Feb. 28, 2008

(65) Prior Publication Data

US 2009/0219766 A1    Sep. 3, 2009

(51) Int. Cl.
*G06F 12/02* (2006.01)
(52) U.S. Cl. ........................................ 711/170
(58) Field of Classification Search ................ None
See application file for complete search history.

(56) References Cited

U.S. PATENT DOCUMENTS

| | | | |
|---|---|---|---|
| 6,005,412 A | 12/1999 | Ranjan et al. | |
| 6,801,869 B2 | 10/2004 | McCord | |
| 6,940,768 B2 | 9/2005 | Dahlberg et al. | |
| 7,047,458 B2 * | 5/2006 | Nejedlo et al. | 714/715 |
| 7,116,589 B2 | 10/2006 | Stubbs | |
| 7,586,799 B2 * | 9/2009 | Richards | 365/193 |
| 7,676,684 B2 * | 3/2010 | Ando | 713/400 |
| 2002/0067645 A1 * | 6/2002 | Ohmori et al. | 365/200 |
| 2002/0173925 A1 * | 11/2002 | Sugawara et al. | 702/107 |

* cited by examiner

*Primary Examiner* — Duc T Doan
(74) *Attorney, Agent, or Firm* — Kunzler Needham Massey & Thorpe

(57) ABSTRACT

An apparatus, system, and method are disclosed for adjusting memory hold time. A detection module detects a hold time violation for a memory. An adjustment module increases a first voltage of a voltage controller in response to the hold time violation. The voltage controller supplies electrical current at the first voltage to a memory controller and at a reference voltage to the memory. The first and reference voltages are set independently.

22 Claims, 10 Drawing Sheets

APPARATUS, SYSTEM, AND METHOD FOR ADJUSTING MEMORY HOLD TIME

BACKGROUND OF THE INVENTION

1. Field of the Invention

This invention relates to memory hold time and more particularly relates to adjusting memory hold time.

2. Description of the Related Art

Computers often use memory modules, referred to hereafter as memory, such as Double Data Rate (DDR) memory to store working programs and data. For example, a computer with 1 GB of memory may employ two 512 MB memories. The memories allow each computer to be configured with more or less memory.

The memories receive data and an address over one or more buses from a memory controller. The data and address are referred to herein as data. The memory controller also communicates a data strobe to the memories. The data strobe indicates that the data is valid and will be valid for specified hold time. As used herein, the hold time is a time interval after receipt of the data strobe for which the data must be valid. The data strobe directs the memories to receive and store the data. The memories store the data if the data is valid for the hold time.

Unfortunately, as computers use increasing numbers of memories, a slew rate of the data strobe may decrease. As used herein, the slew rate is a maximum rate of change for an electrical signal such as a data strobe. For example, if a second memory is added to a computer with a first memory, the slew rate of the data strobe for the first and second memories may be reduced. As a result, a memory may receive a valid data strobe later than intended, reducing the hold time.

If the hold time is reduced sufficiently, a minimum hold time for a memory may be violated. When the minimum hold time is violated, data that is to be stored in a memory may be invalid when the memory attempts to latch the data. As a result, the memory may not function correctly and erroneous data may be stored.

SUMMARY OF THE INVENTION

From the foregoing discussion, there is a need for an apparatus, system, and method that adjust memory hold time. Beneficially, such an apparatus, system, and method would increase the slew rate of a data strobe to increase the memory hold time.

The present invention has been developed in response to the present state of the art, and in particular, in response to the problems and needs in the art that have not yet been fully solved by currently available hold time adjustment methods. Accordingly, the present invention has been developed to provide an apparatus, system, and method for adjusting memory hold time that overcome many or all of the above-discussed shortcomings in the art.

The apparatus to adjust memory hold time is provided with a plurality of modules configured to functionally execute the steps of detecting a hold time violation and increasing a first voltage. These modules in the described embodiments include a detection module and an adjustment module.

The detection module detects a hold time violation for a memory. The adjustment module increases a first voltage of a voltage controller in response to the hold time violation. The voltage controller supplies electrical current at the first voltage to a memory controller and at a reference voltage to the memory. The first and reference voltages are set independently.

A system of the present invention is also presented to adjust memory voltage. The system may be embodied in a computer. In particular, the system, in one embodiment, includes at least one DDR memory, a voltage controller, a detection module, and an adjustment module.

The memory controller communicates with the at least one DDR memory. The voltage controller supplies electrical current at a first voltage to the memory controller and a reference voltage to the at least one DDR memory. The first and reference voltages are set independently.

The detection module detects a hold time violation for a memory. The adjustment module increases a first voltage of a voltage controller in response to the hold time violation.

A method of the present invention is also presented for adjusting memory hold time. The method in the disclosed embodiments substantially includes the steps to carry out the functions presented above with respect to the operation of the described apparatus and system. In one embodiment, the method includes detecting a hold time violation and increasing a first voltage.

A voltage controller supplies electrical current at a first voltage to a memory controller and at a reference voltage to a memory. The first and reference voltages are set independently. A detection module detects a hold time violation for the memory. An adjustment module increases the first voltage of the voltage controller in response to the hold time violation.

References throughout this specification to features, advantages, or similar language do not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The present invention adjusts memory hold times to mitigate against a hold time violation. These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Many of the functional units described in this specification have been labeled as modules, in order to more particularly emphasize their implementation independence. Modules may include hardware circuits such as one or more processors with memory, Very Large Scale Integration (VLSI) circuits, gate arrays, programmable logic, and/or discrete components. The hardware circuits may perform hardwired logic functions, execute computer readable programs stored on tangible storage devices, and/or execute programmed functions. The computer readable programs may in combination with a computer system perform the functions of the invention.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
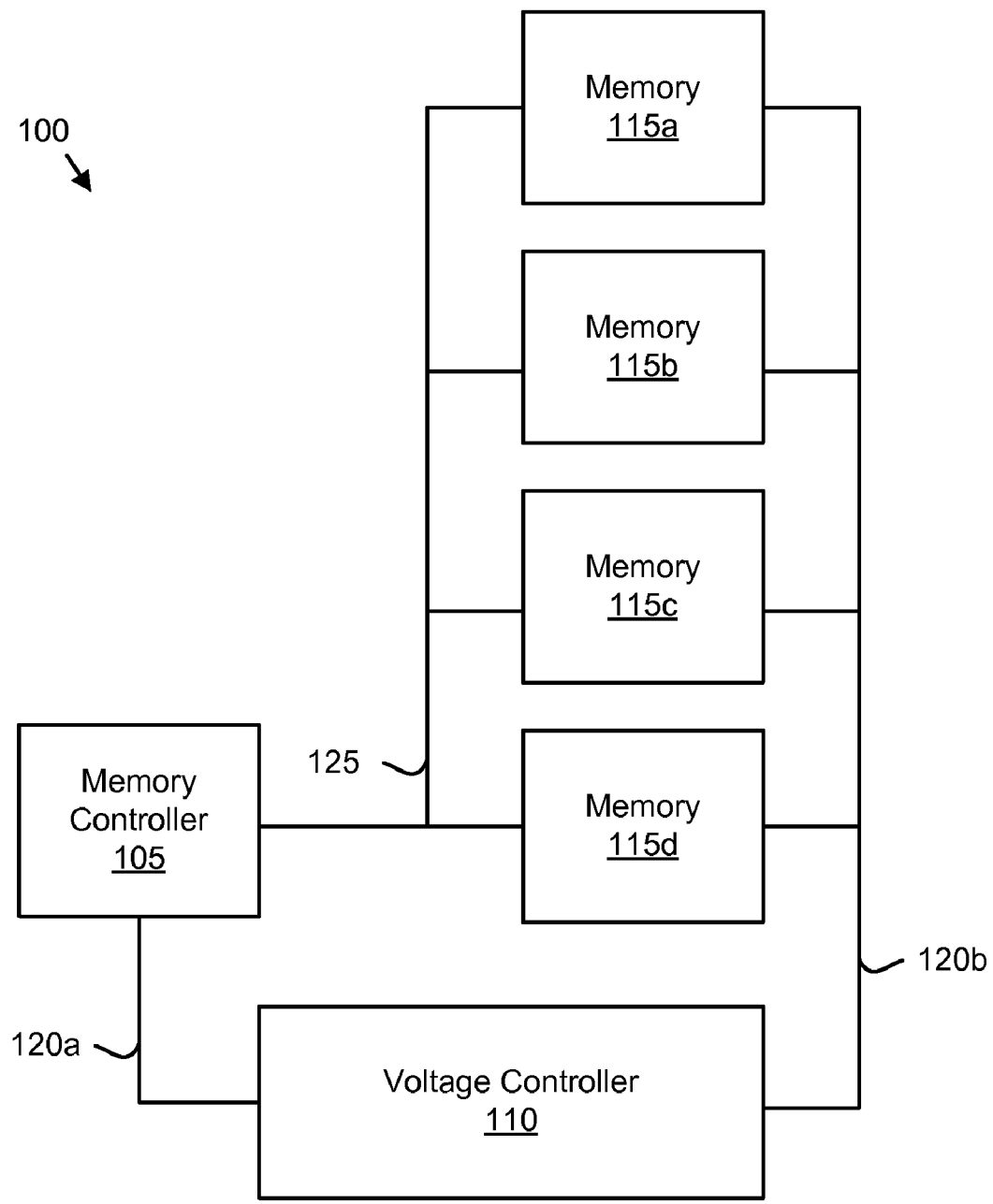
FIG. 1 is a schematic block diagram illustrating one embodiment of a memory system in accordance with the present invention.

FIG. 1 is a schematic block diagram illustrating one embodiment of a memory system 100 in accordance with the present invention. The system 100 may be embodied in a computer such as a computer workstation, a server, a laptop computer, and the like. As depicted, the system 100 includes a memory controller 105, a voltage controller 110, one or more memories 115, a first power line 120a, a reference power line 120b, and a data bus 125. Although for simplicity the system 100 is depicted with four memories 115, any number of memories 115 may be employed.

The memories 115 may be DDR memory. In one embodiment, each memory 115 may be configured as a memory module and/or daughter card. A memory 115 may be installed in physical and electrical communication with a circuit board such as a motherboard. In one embodiment, the memory controller 105 and the voltage controller 110 reside on the circuit board. The memory controller 105 and the voltage controller 110 may communicate with each memory 115 through a connector as will be described hereafter.

The voltage controller 110 supplies an electric current to the memory controller 105 at a first voltage through the first power line 120a. In addition, the voltage controller 110 supplies electric current to the memories 115 at a reference voltage through the reference power line 120b. The voltage controller 110 sets the first and reference voltages independently. For example, the voltage controller 110 may set the first voltage to three point three volts (3.3 V) and the reference voltage to one point six volts (1.6 V).

In one embodiment, the reference voltage may be created by dividing the first voltage with a resistor bridge as is well known to those of skill in the art. For example, the reference voltage may be half the first voltage. The reference power line 120b may also supply the reference voltage to the memory controller 105. In addition, the voltage controller 110 may supply other voltages at additional voltage levels to the memory controller 105 and the memories 115. However, for simplicity, only the first power line 120a and the reference power line 120b are shown.

The data bus 125 comprises a plurality of digital electric signal lines. In one embodiment, the data bus 125 includes a plurality of address lines, a plurality of data lines, and a plurality of control lines as is well known to those of skill in the art. The address lines may identify an address for storing and/or retrieving data. The data lines may communicate a digital value that is to be stored or retrieved.

The data bus 125 may include a data strobe. The data strobe may indicate that the digital values on the data and address lines are valid. The memory controller 105 may assert the data strobe to write data to the memories 115. As memories 115 are added to the system 100, the slew rate of the data strobe may decrease. As a result, a minimum hold time for the memories 115 may be violated. The present invention adjusts the hold times as will be described hereafter.

Figure 2:
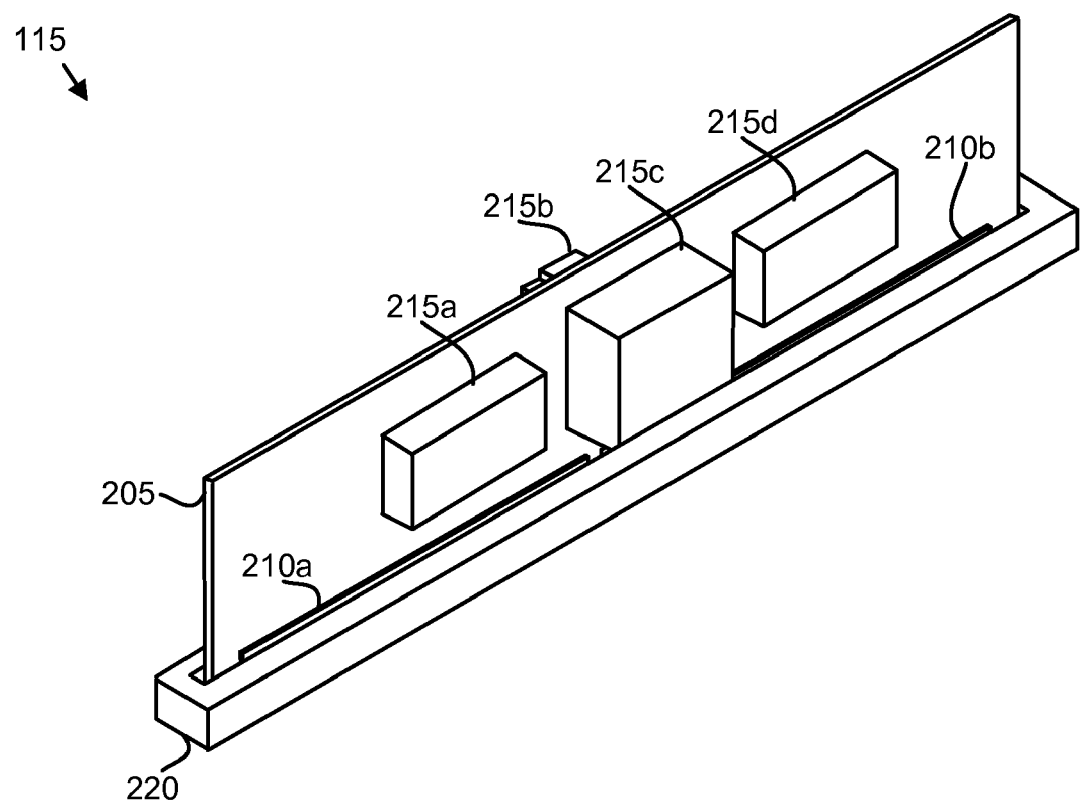
FIG. 2 is a perspective view of one embodiment of a memory in accordance with the present invention.

FIG. 2 is a perspective view illustrating one embodiment of a memory 115 of the present invention. The memory 115 is the memory 115 of FIG. 1. The description of the memory 115 refers to elements of FIG. 1, like numbers referring to like elements. The memory 115 includes a circuit card 205, one or more edge card connectors 210, one or more semiconductor devices 215, and a connector 220.

The data bus 125 may communicate with the connector 220. The electrical signals of the data bus 125 are passed between the connector 220 in the edge card connectors 210. The semiconductor devices 215 are an electrical communication with the edge card connectors 210 through a plurality of circuit card traces.

The semiconductor devices 215 may include Dynamic Random Access Memory (DRAM) devices including Synchronous DRAM (SDRAM) devices, an interface device, and the like. The DRAM devices may be configured as DDR SDRAM memory, including DDR2 and DDR3.

Figure 3:
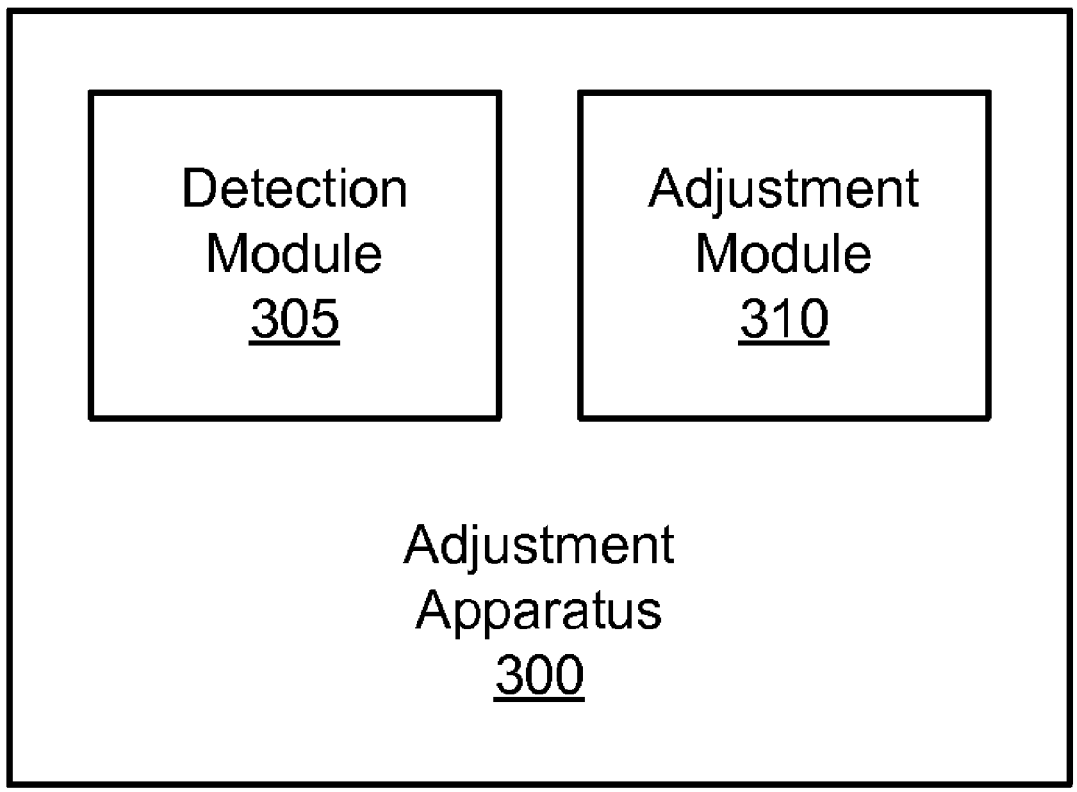
FIG. 3 is a schematic block diagram illustrating one embodiment of an adjustment apparatus of the present invention.

FIG. 3 is a schematic block diagram illustrating one embodiment of an adjustment apparatus 300 of the present invention. The description of the apparatus 300 refers to elements of FIGS. 1-2, like numbers referring to like elements. The apparatus 300 includes a detection module 305 and an adjustment module 310.

The detection module 305 detects a hold time violation for a memory 115. In one embodiment, the detection module 305 detects the hold time violation by detecting a decrease in the slew rate of the data strobe as will be described hereafter. In one embodiment, the detection module 305 may be embodied in the memory controller 105 and/or the voltage controller 110. Alternatively, the detection module 305 may be a separate semiconductor device. In a certain embodiment, the detection module 305 includes a discrete test device. Alternatively, the detection module 305 may comprise a computer readable program.

The adjustment module 310 increases the first voltage of the voltage controller 110 in response to the hold time violation. Increasing the first voltage of the first power line 120 increases the slew rate of the data strobe. As a result, the adjustment module 310 may adjusts the first voltage until the data hold times for the memories 115 are satisfied.

The adjustment module 310 may be embodied in the memory controller 105, the voltage controller 110, and/or a discrete semiconductor device. In one embodiment, the adjustment module 310 comprises a computer program product with a computer usable medium that has a computer readable program stored on a tangible storage device. The computer readable program may be executed by a processor.

The schematic flow chart diagram that follows is generally set forth as a logical flow chart diagram. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 4:
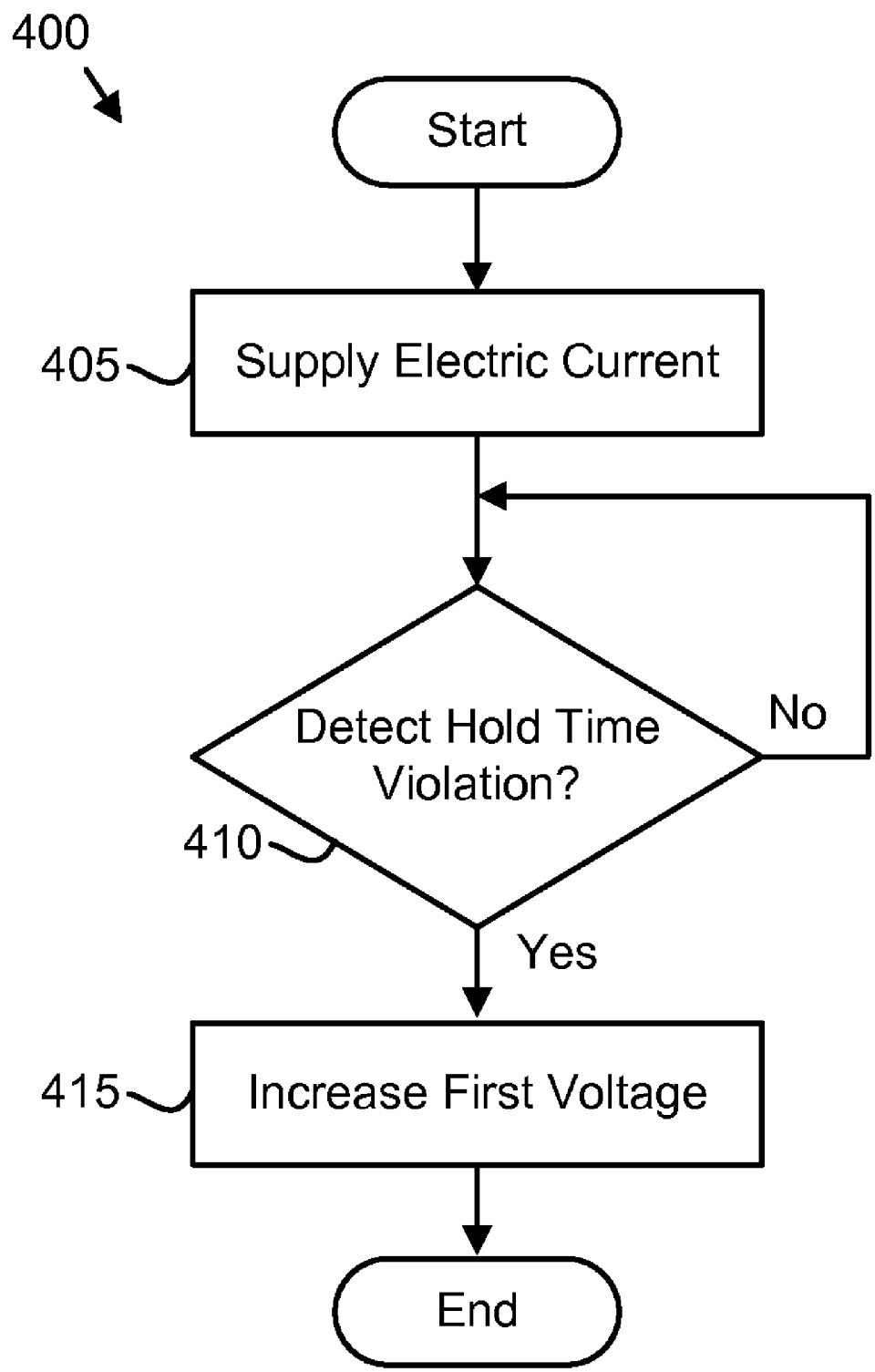
FIG. 4 is a schematic flow chart diagram illustrating one embodiment of an adjustment method of the present invention.

FIG. 4 is a schematic flow chart diagram illustrating one embodiment of an adjustment method 400 of the present invention. The method 400 substantially includes the steps to carry out the functions presented above with respect to the operation of the described apparatus and system of FIGS. 1-3. In one embodiment, the method 400 is implemented with a computer program product comprising a computer readable medium having a computer readable program. The computer readable program may be integrated into a digital device, such as the memory controller 105, the voltage controller, a computer processor, wherein the program in combination with the digital is capable of performing the method 400.

In an alternate embodiment, the method 400 may be implemented with a plurality of semiconductor gates as is well known to those of skill in the art. The semiconductor gates may be consolidated into a single device such as a memory controller 105. Alternatively, the semiconductor gates may be distributed among a plurality of devices such as a memory controller 105, the voltage controller 110, and the like.

The method 400 starts, and the voltage controller 110 supplies 405 electrical current at the first voltage to the memory controller 100. In addition, the voltage controller 110 supplies electrical current at the reference voltage to the memories 115. The first voltage and reference voltage are set independently.

The detection module 305 detects 410 a hold time violation for at least one memory 115. In one embodiment, the detection module 305 samples voltages of the data strobe at one or more locations along a data strobe line.

For example, the detection module 305 may sample the data strobe voltage at the memory controller 105 and at a memory 115. The memory 115 may have a data strobe connection with the greatest data strobe line distance from the memory controller 105.

The detection module 305 may measure a time interval between when the data strobe voltage at the memory controller 105 reaches a specified voltage at initiation and when the data strobe voltage at the memory 115 reaches the specified voltage. In a certain embodiment, the detection module 305 detects the hold time violation if the time interval exceeds a time threshold.

In an alternate embodiment, the detection module 305 may detect 410 a hold time violation by detecting errors writing data to the memories 115. For example, the detection module 305 may write a plurality of known data values to the memories 115. The detection module 305 may then read the data values from the memories 115 and compare the read data values with the original known data values. If one or more read data values are not equivalent to the corresponding known data values, the detection module 305 may detect 410 the hold time violation.

In one embodiment, the detection module 305 may detect 410 the hold time violation by measuring a reflection of the data strobe. For example, the detection module 305 may measure a reflection time interval from an initiation of the data strobe signal to receiving a reflection of the data strobe signal onto data strobe line. The detection module 305 may detect a hold time violation if the reflection time interval exceeds a specified reflection time threshold.

In a certain embodiment, the detection module 305 receives voltage data on the data strobe slew rate from an external test device. For example, the external test device may measure the data strobe voltage at one or more locations between a memory controller 105 and a memory 115 with a data strobe line connection farthest from the memory controller 105. The test device may communicate the voltage data to the detection module 305.

If the detection module 305 does not detect 410 the hold time violation, the detection module 305 may continue to test for a hold time violation. Alternatively, the method 400 may end.

If the detection module 305 detects 410 the hold time violation, the adjustment module 310 increases 415 the first voltage of the voltage controller 110 in response to the hold time violation and the method 400 ends. In one embodiment, the adjustment module 310 communicates a digital voltage value to the voltage controller 110. The voltage controller 110 may modify the first voltage to match up the voltage value.

In an alternate embodiment, the adjustment module 310 communicates an analog voltage value to the voltage controller 110. The voltage controller 110 may modify the first voltage to match the analog voltage value.

By increasing the first voltage, the method 400 may adjust the hold time for the memories 115 to meet or exceed the minimum hold time. In one embodiment, the method 400 may allow the memory system 100 to utilize memories 115 that would otherwise cause the memory system 100 to fail. In addition, the method 400 allows a manufacturer and/or user to reliably add a plurality of memories 115 to the memory system 100.

Figure 5:
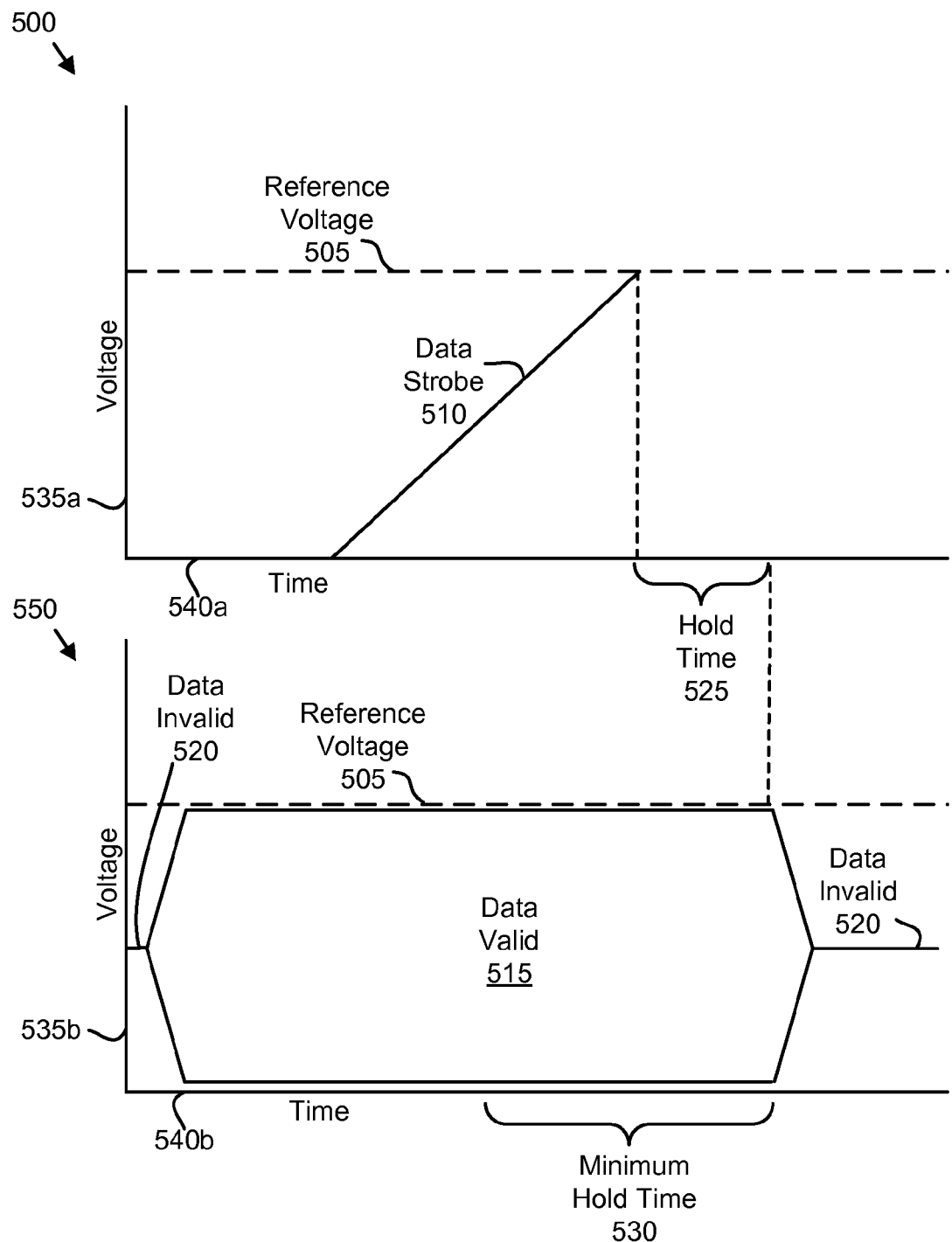
FIG. 5 is timing diagrams illustrating one embodiment of signals in accordance with the present invention.

FIG. 5 includes timing diagrams 500, 550 illustrating one embodiment of signals in accordance with the present invention. The description of the timing diagrams 500, 550 refers to elements of FIGS. 1-4, like numbers referring to like elements. A first timing diagram 500 shows a voltage 535a of the data strobe 510 as a function of time 540a. A second timing diagram 550 depicts valid data 515 and invalid data 520 as a function of time 540b.

In one embodiment, the valid data 515 is indicative that data signals of the data bus 125 have voltage values 535b that are within the specified range for one of two binary values as is well known to those of skill in the art. The invalid data 520 may be indicative that one or more data signals of a data bus 125 are not within the specified voltage range for one of two binary values.

The reference voltage 505 of the reference power line 120b is shown relative to the data strobe 510, the valid data 515, and the invalid data 520. In one embodiment, the reference voltage 505 may be held at the constant voltage value. The memories 115 may use the reference voltage 505 to determine when the data strobe 510 is asserted. For example, a memory 115 may determine that the data strobe 510 is asserted when the voltage of the data strobe 510 is substantially equivalent to the reference voltage 505.

A time interval from the assertion of the data strobe 510 until the data signals of the data bus 125 transition from data valid 515 to data invalid 520 is the hold time 525. The memories 115 may latch the data values of the data bus 125 during the hold time 525.

The memories 115 typically have a minimum hold time 530. If the data values of the data bus 125 are valid over the minimum hold time 530 the memories 115 may reliably latch the data values. However, when the hold time 525 is less than the minimum hold time 530, the memories 115 may not reliably latch the data values of the data bus 125.

The voltage of the data strobe 510 increases from an initial low value prior to assertion by the memory controller 105 until the data strobe voltage is at least equivalent to the reference voltage 505. The rate of change of the voltage of the data strobe 510 is the data strobe slew rate. As depicted in FIG. 5, the low slew rate of the data strobe 510 results in a hold time 525 that violates the minimum hold time 530 for the memories 115. The present invention adjusts the voltage to the memory controller 105 to increase the slew rate of the data strobe 510 and increase the hold time 525 as will be shown hereafter.

Figure 6:
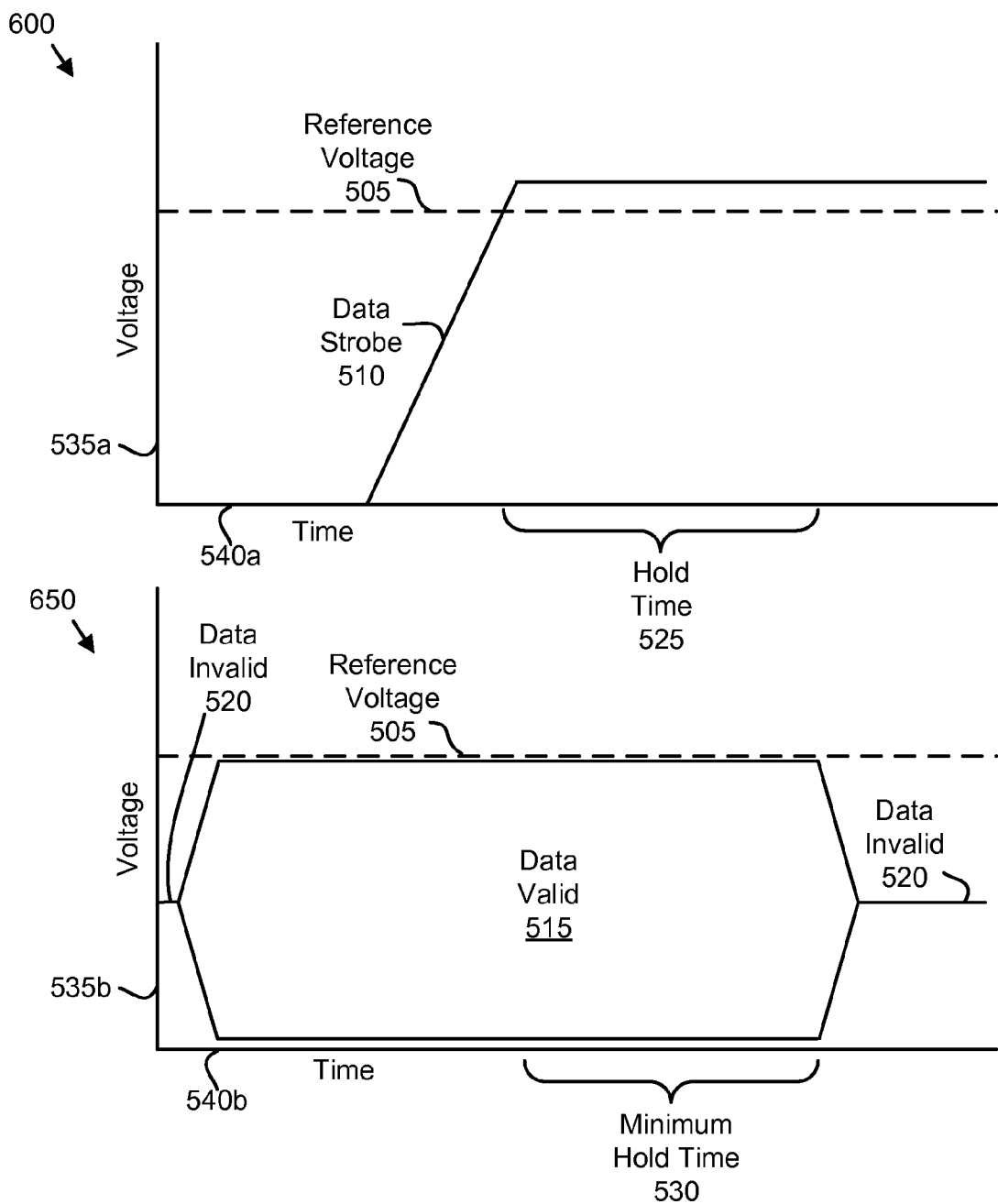
FIG. 6 is timing diagrams illustrating one embodiment of an adjusted data strobe of the present invention.

FIG. 6 includes timing diagrams 600, 650 illustrating one embodiment of an adjusted data strobe 510 of the present invention. The timing diagrams 600, 650 are the timing diagrams 500, 550 of FIG. 5 with the slew rate of the data strobe 510 adjusted.

The slew rate of the data strobe 510 is increased from the depiction in FIG. 5. The increase in the slew rate is due to the adjustment module 310 increasing 415 the first voltage of the first power line 120a. As a result, the voltage of the asserted data strobe 510 may be higher than the reference voltage 505.

As depicted, the hold time 525 is increased so that the hold time 525 exceeds the minimum hold time 530. By increasing the first voltage, the present invention allows the memory system 100 to meet the minimum hold time 530 for the memories 115.

Figure 7:
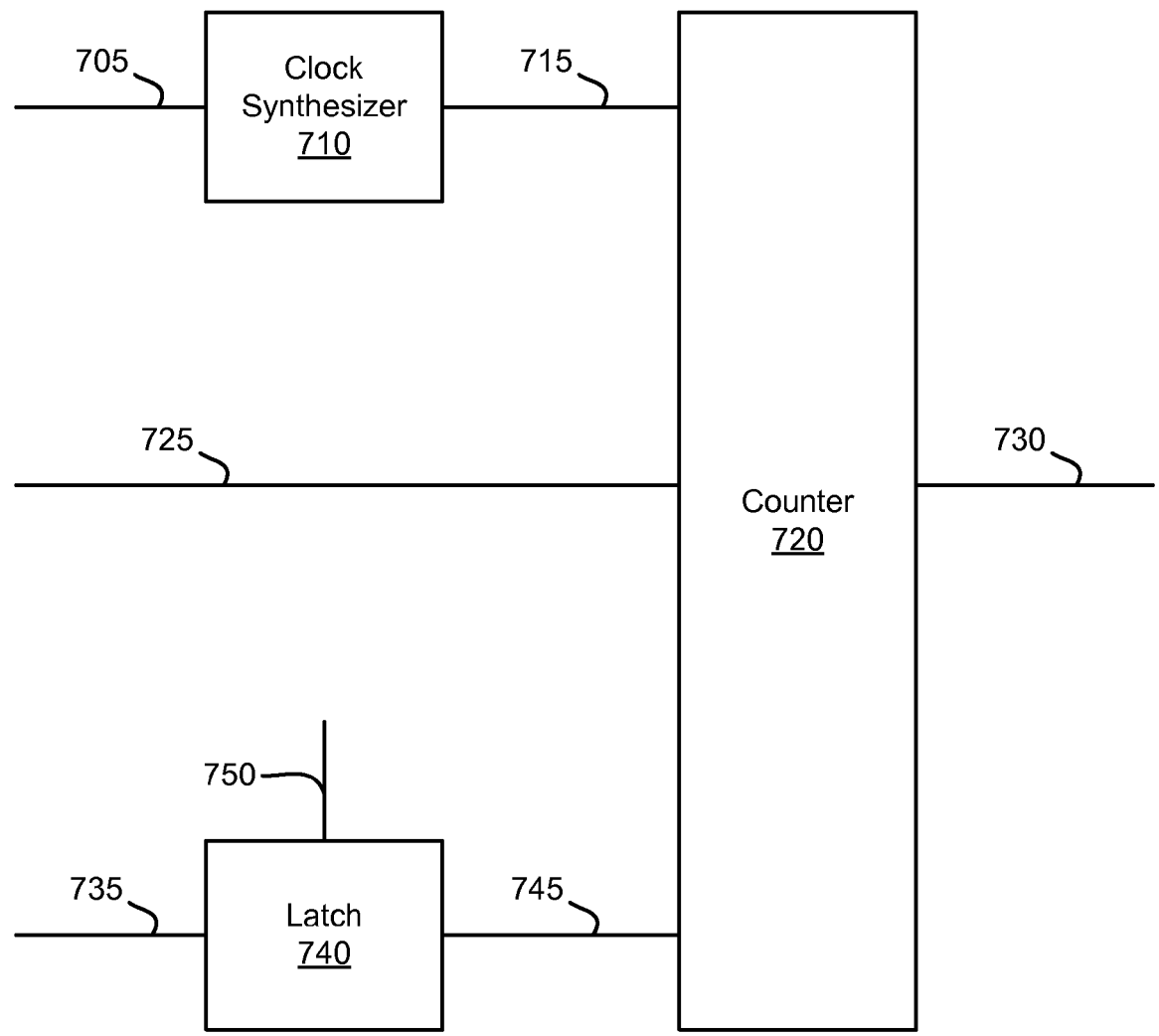
FIG. 7 is a schematic block diagram illustrating one embodiment of a counter device of the present invention.

FIG. 7 is a schematic block diagram illustrating one embodiment of a counter device 700 of the present invention. The counter device 700 may be embodied in the detection module 305. The description of the counter device 700 refers to elements of FIGS. 1-6, like numbers referring to like elements. The device 700 includes a clock input 705, a clock synthesizer 710, a clock signal 715, a counter 720, a first sample 725, a second sample 735, a reset signal 750, a latch 740, a stop count signal 745, and a count signal 730.

The clock input 705 may be a clock of the memory system 100. The clock synthesizer 710 generates the clock signal 715, wherein the clock signal 715 oscillates at a higher rate than the clock input 705.

The counter 720 may be configured to increment a count each time the clock signal 715 is asserted. The count may be stored in the registers of a semiconductor adder as is well known to those of skill in the art. The first sample 725 may reset the count of the counter 720. In one embodiment, the first sample 725 is a sample of the data strobe 510 taken near the memory controller 105. Thus when the memory controller 105 asserts the data strobe 510, the first sample 725 resets the count.

The second sample 735 may be a sample of the data strobe 510 taken at a point of the data strobe line substantially removed from the memory controller 105. Thus the difference in time between an assertion of the first sample 725 and a second sample 735 may be indicative of the slew rate of the data strobe 510.

The latch 740 latches the asserted second sample 735. The latched second sample asserts the stop count signal 745, stopping the counter 720 from increasing the count. The count may not change or be reset until the stop count signal 745 is de-asserted. The latched second sample may only be de-asserted when the detection module 305 asserts the reset signal 750.

In one embodiment, the detection module 305 asserts the reset signal 750. The assertion of the data strobe 510 by the memory controller 105 as sampled by the first sample 725 resets the count. The clock signal 715 increments the count. When the second sample 735 detects the assertion of the data strobe 510, the latched second sample stops the count. The count signal 730 may communicate the count to the detection module 305. The count represents a time interval between the initiation of the data strobe 510 and the assertion of the data strobe 510 at a memory 115. If the count exceeds a specified time threshold, the detection module 305 may detect 410 a hold time violation.

The count device 700 may be embodied in a memory controller 105. Alternatively, the count device 700 may be embodied in a semiconductor device of a computer. The count device 700 allows the detection of a hold time violation without an external test device.

Figure 8:
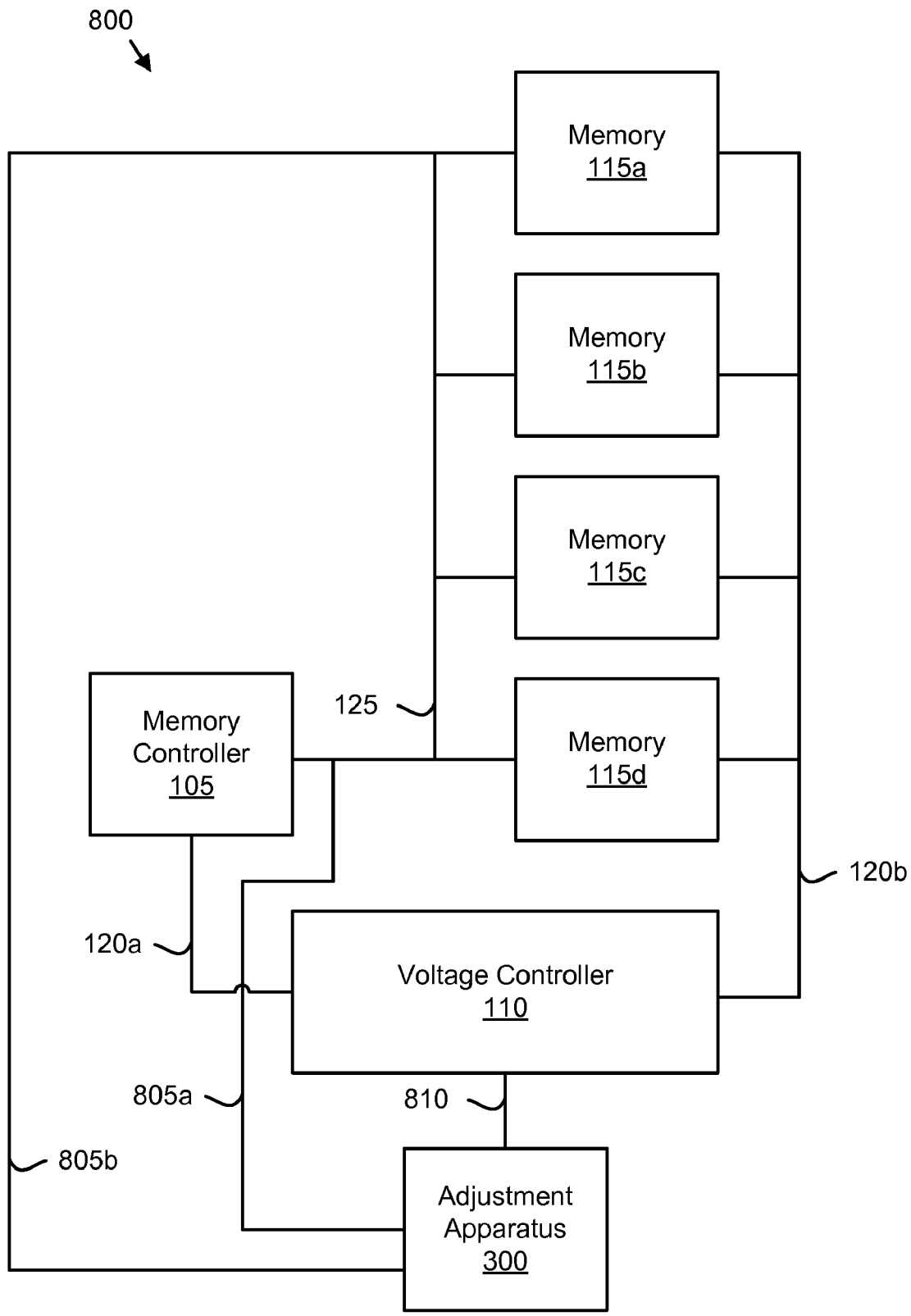
FIG. 8 is a schematic block diagram illustrating one embodiment of an adjustment system of the present invention.

FIG. 8 is a schematic block diagram illustrating one embodiment of an adjustment system 800 of the present invention. The description of the system 800 refers to elements of FIGS. 1-7, like numbers referring to like elements. The memory system 100 of FIG. 1 is shown integrated with the adjustment apparatus 300 of FIG. 3.

The adjustment apparatus 300 is in communication with the voltage controller 110 through a control bus 810. In one embodiment, the control bus 810 is shared with a plurality of devices. Alternatively, the control bus 810 may comprise one or more dedicated control signals. In a certain embodiment, the control bus 810 is an analog signal.

The adjustment apparatus 300 samples the data strobe 510 with a first and second sample line 805a-b. The first sample line 805a may sample the data strobe 510 near the memory controller 105. The second sample line 805b may sample the data strobe 510 at a memory connection that is farthest from the memory controller 105. The detection module 305 may employ the counter device 700 of FIG. 7, wherein the first sample line 805a is the first sample 725 and the second sample line 805b is the second sample 735.

In one embodiment, the adjustment system 800 is integrated into a computer. The system 800 may automatically adjust to hold times for the memories 115 of the computer. Thus the various numbers of memories 115 may be reliably added to the computer.

Figure 9:
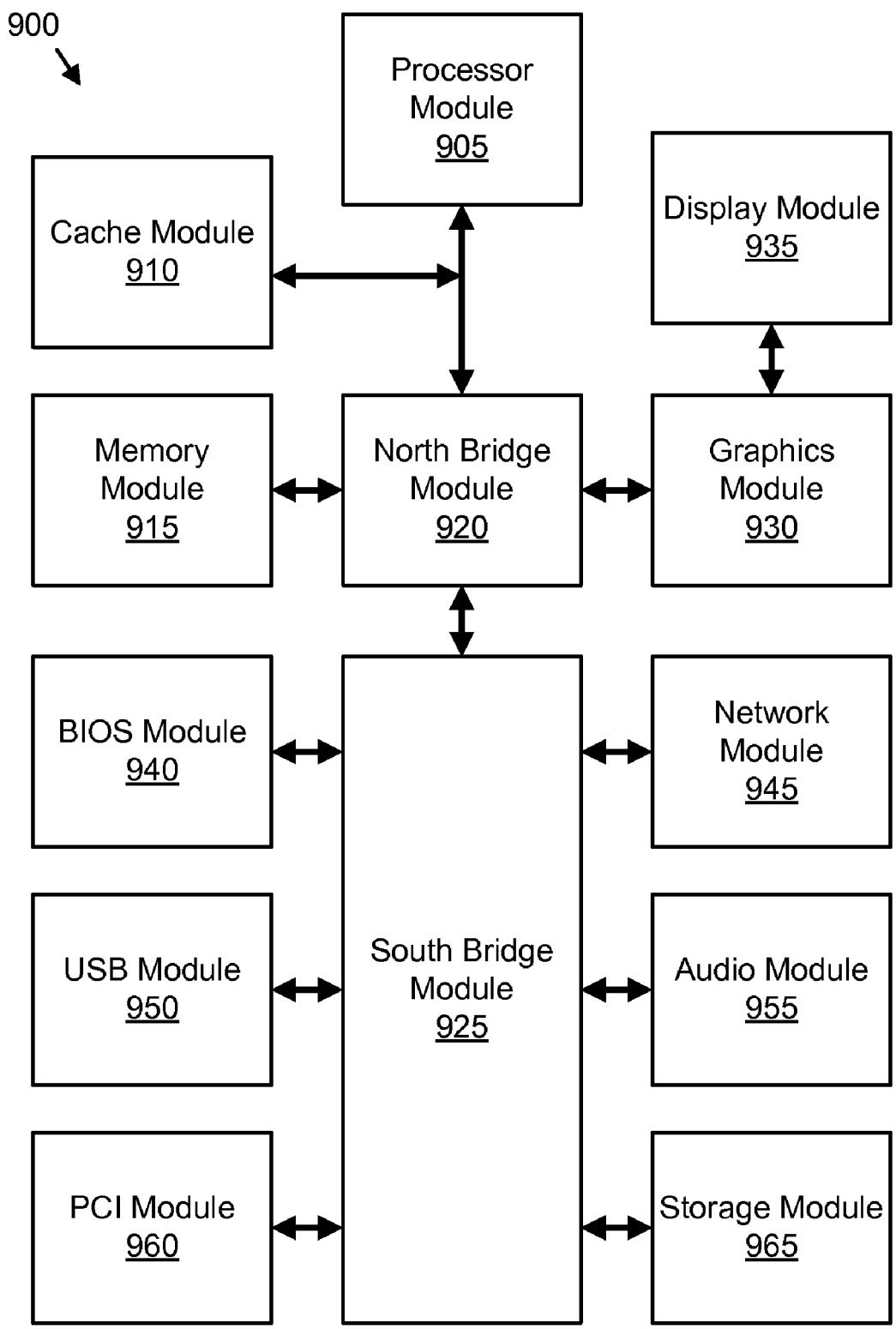
FIG. 9 is a schematic block diagram illustrating one embodiment of a computer of the present invention.

FIG. 9 is a schematic block diagram illustrating one embodiment of a computer 900 of the present invention. The description of the computer 900 refers to elements of FIGS. 1-8, like numbers referring to like elements. The computer 900 includes a processor module 905, a cache module 910, a memory module 915, a north bridge module 920, a south bridge module 925, a graphics module 990, a display module 995, a basic input/output system ("BIOS") module 940, a network module 945, a Universal Serial Bus module 950, an audio module 955, a peripheral component interconnect ("PCI") module 960, and a storage module 965.

The processor module 905, cache module 910, memory module 915, north bridge module 920, south bridge module 925, graphics module 990, display module 995, BIOS module 940, network module 945, USB module 950, audio module 955, PCI module 960, and storage module 965, referred to herein as components, may be fabricated of semiconductor gates on one or more semiconductor substrates. Each semiconductor substrate may be packaged in one or more semiconductor devices mounted on circuit cards. Connections between the components may be through semiconductor metal layers, substrate-to-substrate wiring, circuit card traces, and/or wires connecting the semiconductor devices.

The memory module 915 may comprise the memory system 100 of FIG. 1. The memory module 915 stores software instructions and data. The processor module 905 executes the software instructions and manipulates the data as is well known to those skilled in the art. The software instructions and data may be configured as one or more computer readable programs. The computer readable programs may be tangibly stored in the storage module 965. The storage module 965 may be a hard disk drive, an optical storage device, a holographic storage device, a micromechanical storage device, a semiconductor storage device, or the like.

In one embodiment, the computer readable programs comprise portions of the detection module 305 and the adjustment module 310. The computer readable programs may direct the processor module 905 to execute the method 400 of FIG. 4.

The north bridge module 920 may communicate with and provide bridging functionality between the processor module 905, the graphic module 990, the memory module 915, and the cache module 910. The processor module 905 may be connected to the north bridge module 920 over a, for example, six hundred sixty seven Megahertz (667 MHz) front side bus.

The north bridge module 920 may be connected to the south bridge module 925 through a direct media interface (DMI) bus. The DMI bus may provide a high-speed, bi-directional, point-to-point link supporting a clock rate for example of one Gigabytes per second (1 GBps) in each direction between the north bridge module 920 and the south bridge module 925. The south bridge module 925 may support and communicate with the BIOS module 940, the network module 945, the PCI module 960, and the storage module 965.

The PCI module 960 may communicate with the south bridge module 925 for transferring data or power to peripheral devices. The PCI module 960 may include a PCI bus for attaching the peripheral devices. The PCI bus can logically connect several peripheral devices over the same set of connections. The peripherals may be selected from a printer, a joystick, a scanner, or the like.

The BIOS module 940 may communicate instructions through the south bridge module 925 to boot the computer 900, so that software instructions stored on the storage module 965 can load, execute, and assume control of the computer 900. Alternatively, the BIOS module 940 may comprise a coded program embedded on a chipset that recognizes and controls various devices that make up the computer 900.

In one embodiment, the BIOS module 940 may include instructions that cause the processor module 905 to direct the counter device 700 to measure a time interval. The counter device 700 may communicate the time interval to the processor module 905 through the PCI module 960. Responsive to the time interval, the processor module 905 may direct the adjustment module 310 through the PCI module 960 to increase 415 the first voltage.

Figure 10:
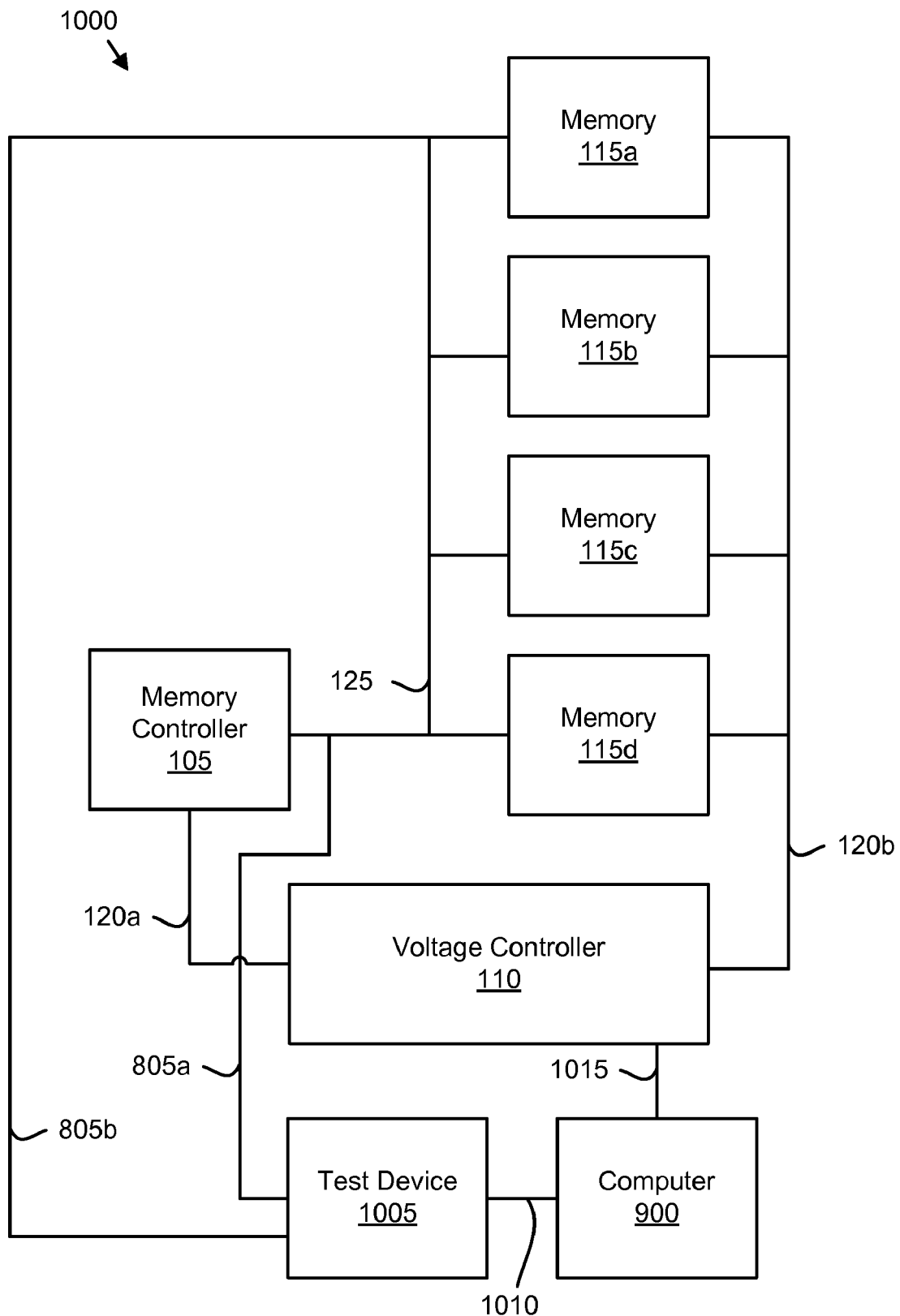
FIG. 10 is a schematic block diagram illustrating one alternate embodiment of an adjustment system of the present invention.

FIG. 10 is a schematic block diagram illustrating one of an alternate embodiment of an adjustment system 1000 of the present invention. The system 1000 includes the computer 900 of FIG. 9. The system 1000 further shows the memory system 100 of FIG. 1. Although the memory system 100 may be embodied in a memory module 915 of the computer 900, for clarity the memory system 100 is shown separate from the computer 900.

A test device 1005 is also shown. The test device 1005 may be external to the computer 900. The test device 1005 may be an oscilloscope, a digital logic analyzer, and the like. The test device 1005 samples the data strobe 510 using the first and second sample lines 805a-b. In one embodiment, the test device 1005 communicates a time interval to the computer 900. The test device 1005 may communicate the time interval through a USB cable 1010 connected to the USB module 950. The detection module 305 executing on a processor module 905 may detect 410 a hold time violation for the memories 115. The adjustment module 310 executing on a processor module 905 may increase 415 the first voltage so that the hold time of the memories 115 satisfies the minimum hold time.

The system 1000 supports the adjustment of the hold times for the memories 115 in a manufacturing and/or service environment. For example, the system 1000 may allow a service technician to reliably install additional memories 115 in a computer 900. Alternatively, the system 1000 may support the reliable installation of memories 115 in the computer 900 during manufacture of the computer 900.

The present invention adjusts memory hold times 530 to mitigate against a hold time violation. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to adjust memory hold time, the apparatus comprising:
   a detection module configured to detect a hold time violation for at least one memory, the detection module monitoring a time interval between an initiation of a data strobe and a receipt of the data strobe at the at least one memory; and
   an adjustment module configured to increase a first voltage of a voltage controller in response to the hold time violation, the increase in the first voltage increasing a data strobe voltage, the voltage controller configured to supply electrical current at the first voltage to a memory controller and at a reference voltage to the at least one memory, wherein the first and reference voltages are set independently.

2. The apparatus of claim 1, wherein the at least one memory is a Double Data Rate (DDR) memory.

3. The apparatus of claim 1, wherein the detection module, the adjustment module, the at least one memory, the memory controller, and the voltage controller are integrated in a computer.

4. The apparatus of claim 3, wherein the detection module periodically monitors the hold time.

5. The apparatus of claim 3, wherein the detection module comprises a counter configured to count time intervals between an initiation of the data strobe and a receipt of the data strobe at the at least one memory.

6. The apparatus of claim 1, wherein the at least one memory, the memory controller, and the voltage controller are integrated in a computer and the detection module is configured as a test device independent of the computer.

7. The apparatus of claim 6, wherein the adjustment module adjusts the first voltage by communicating a first voltage value to the voltage controller.

8. The apparatus of claim 1, the apparatus further comprising:
    means for detecting the hold time violation for the at least one DDR memory; and
    means for increasing the first voltage of the voltage controller in response to the hold time violation.

9. A computer program product comprising a computer readable program stored on a tangible, non-transitory storage device, wherein the computer readable program when executed on a computer causes the computer to:
    monitoring a time interval between an initiation of a data strobe and a receipt of the data strobe by at least one memory
    detect a hold time violation for the at least one memory; and increase a first voltage of a voltage controller in response to the hold time violation, the increase in the first voltage
    increasing a data strobe voltage, the voltage controller configured to supply electrical current at the first voltage to a memory controller and at a reference voltage to the at least one memory, wherein the first and reference voltages are set independently.

10. The computer program product of claim 9, wherein the at least one memory is a Double Data Rate (DDR) memory.

11. The computer program product of claim 9, wherein the computer readable program is further configured to cause the computer to receive a plurality of data strobe voltage values from a test device independent of a computer embodying the computer program product.

12. The computer program product of claim 11, wherein the adjustment module adjusts the first voltage by communicating a first voltage value to the voltage controller.

13. A system to adjust memory hold time, the system comprising:
    at least one Double Data Rate (DDR) memory;
    a memory controller configured to communicate with the at least one DDR memory;
    a voltage controller configured to supply electrical current at a first voltage to the memory controller and a reference voltage to the at least one DDR memory, wherein the first and reference voltages are set independently;
    a detection module configured to detect a hold time violation for the at least one memory, the detection module monitoring a time interval between an initiation of a data strobe and a receipt of the data strobe at the at least one DDR memory; and
    an adjustment module configured to increase the first voltage in response to the hold time violation, the increase in the first voltage increasing a data strobe voltage.

14. The system of claim 13, wherein the detection module, the adjustment module, the at least one memory, the memory controller, and the voltage controller are integrated in a computer.

15. The system of claim 14, wherein the detection module periodically monitors the hold time.

16. The system of claim 13, wherein the detection module comprises a counter configured to count time intervals between an initiation of the data strobe and a receipt of the data strobe.

17. The system of claim 13, wherein the at least one memory, the memory controller, and the voltage controller are integrated in a computer and the detection module is configured as a test device independent of the computer.

18. The system of claim 17, wherein the adjustment module adjusts the first voltage by communicating a first voltage value to the voltage controller.

19. A method to adjust hold time, the method comprising:
    monitoring a time interval between an initiation of a data strobe and a receipt of the data strobe at least one Double Data Rate (DDR) memory;
    detecting a hold time violation for the at least one DDR memory; and
    increasing a first voltage of a voltage controller in response to the hold time violation, the increase in the first voltage increasing a data strobe voltage, the voltage controller configured to supply electrical current at the first voltage to a memory controller and at a reference voltage to the least one DDR memory, wherein the first and reference voltages are set independently.

20. The method of claim 19, wherein the method comprises receiving a plurality of data strobe voltage values from a test device independent of a computer embodying the at least one DDR memory and the voltage controller.

21. The method of claim 20, wherein the adjustment module adjusts the first voltage by communicating a first voltage value to the voltage controller.

22. The method of claim 19, wherein the detection module comprises a counter configured to count time intervals between an initiation of the data strobe and a receipt of the data strobe.

* * * * *